(12) United States Patent
Lo

(10) Patent No.: US 6,243,266 B1
(45) Date of Patent: Jun. 5, 2001

(54) LOCKING DEVICE FOR CPU PACKAGES OF DIFFERENT THICKNESSES

(75) Inventor: Wei-Ta Lo, Miou-Li (TW)

(73) Assignee: Foxconn Precision Components Co., Ltd., Taipei Hsien (TW)

(*) Notice: Subject to any disclaimer, the term of this patent is extended or adjusted under 35 U.S.C. 154(b) by 0 days.

(21) Appl. No.: 09/442,593

(22) Filed: Nov. 17, 1999

(30) Foreign Application Priority Data

May 15, 1999 (TW) .................................................. 88207781

(51) Int. Cl.[7] ...................................................... H05K 7/20
(52) U.S. Cl. .......................... 361/704; 24/458; 248/510; 361/719
(58) Field of Search ............................... 24/295, 457, 458, 24/625; 174/16.3; 165/80.3, 185; 257/706, 707, 718, 719, 723–727; 361/703, 704, 707, 709, 710, 715–719; 267/150, 158, 160; 248/505, 510

(56) References Cited

U.S. PATENT DOCUMENTS 5,978,223 * 11/1999 Hamilton .
5,982,622 * 11/1999 Chiou .
6,008,990 * 12/1999 Liu .

* cited by examiner

Primary Examiner—Gerald Tolin
(74) Attorney, Agent, or Firm—Wei Te Chung

(57) ABSTRACT

A locking device comprises a number of pegs and a bracket for securely locking a heat sink to CPU packages of a range of thicknesses. The pegs each have a cap for securing against a heat sink and a neck adapted for engaging with a slot of the bracket. The bracket fits against a bottom surface of the CPU package and includes a base and a number of essentially similar cantilever parts depending from the base. Each cantilever part forms a pair of locking recesses at different heights above the base, and a sustaining flange at distal ends of the locking recesses. Each sustaining flange forms an engaging surface which is coplanar with a mating surface of the base for pressing against the bottom surface of the CPU package. The slot extends between the locking recesses. During assembly, the neck slides along the slot and is secured in either locking recess of the bracket. Since the locking recesses are at different heights above the base, the locking device is adapted for accommodating CPU packages of different thicknesses.

10 Claims, 7 Drawing Sheets

LOCKING DEVICE FOR CPU PACKAGES OF DIFFERENT THICKNESSES

BACKGROUND OF THE INVENTION

1. Field of the Invention

The present invention relates to a locking device for locking a heat sink to a CPU package, and particularly to a locking device for locking a heat sink to CPU packages of a range of thicknesses.

2. Brief Description of the Prior Art

FIG. 7 shows a prior art locking device, a CPU package 1 and a heat sink 2 attached to the CPU package 1. The prior art locking device comprises a bracket 4 and a plurality of pegs 3 for locking the heat sink 2 to the CPU package 1. The pegs 3 each have a stanchion 5 with a cap 13 at one end thereof and a head 6 at the other end thereof. Diameters of the heads 6 are slightly larger than those of the stanchions 5. The bracket 4 includes a flat base 11 and a plurality of longitudinally extending cantilever parts 7 extending from the base 1. The cantilever parts 7 are curved while engaging surfaces of all ends thereof are coplanar with a mating surface of the base 11. The curved cantilever parts 7 define a plurality of engaging holes 8. A plurality of slots 9 respectively extends from the engaging holes 8 oriented in a single direction. Lateral dimensions of the slots 9 are slightly larger than those of the stanchions 5 of the pegs 3 for mating with the stanchions 5. The engaging holes 8 are slightly larger than the heads 6 for receiving the heads 6. In assembly, the pegs 3 sequentially penetrate the corresponding subassemblies of the heat sink 2, the CPU package 1, and the engaging holes 8 of the bracket 4. Then, when the bracket 4 is moved slidingly along a bottom surface of the CPU package, the stanchions 5 are moved along the slots 9 and are retained in an end of the slots 9. Therefore, the pegs 3 are attached to the bracket 4 for securing the heat sink 2 and the CPU package 1 in position. With the development of new production technologies, however, PLGA type and OLGA type CPU packages of different thickness are becoming commonplace. The prior art locking device described above is only adapted for locking CPU packages of a fixed thickness. Hence, an improved locking device is required to overcome the disadvantages of the prior art.

BRIEF SUMMARY OF THE INVENTION

A first object of the present invention is to provide an improved locking device adapted for locking a heat sink to CPU packages of different thicknesses;

A second object of the present invention is to provide an improved locking device adapted for locking a heat sink to CPU packages of different thicknesses which decreases the production cost;

A further object of the present invention is to provide an improved locking device adapted for locking a heat sink to CPU packages of different thicknesses which improves assembly efficiency.

To achieve the above objects, a locking device in accordance with the present invention comprises a plurality of pegs and a bracket used to securely lock a heat sink to CPU packages of a range of thicknesses. The pegs each have a stanchion with a cap at one end and a head at an opposite end, and a neck which is smaller in diameter than the stanchion or the head and which connects the head to the stanchion. The bracket has a flat base with a handle portion downwardly depending therefrom and a plurality of cantilever parts longitudinally extending from corners of the base. The cantilever parts each possess a body portion horizontally extending from the base, two resilient ramps respectively extending from opposite ends of the body portion at different angles, two locking recesses respectively extending from the ramps and slightly protruding toward the base, and sustaining flanges respectively extending from the locking recesses and each forming an engaging surface which is coplanar with a mating surface of the base and the body portions for pressing against the CPU package. Each cantilever part has one ramp extending from the body portion thereof at a larger angle than that of the other ramp so that the corresponding locking recess is spaced a greater vertical distance above the base than the other locking recess. The cantilever parts each define a slot extending from the first locking recess to the second locking recess. The dimensions of the slots are slightly larger than those of the necks of the pegs for engaging with the necks. The body portions each define an engaging hole intersected by the slot. The engaging holes are adapted for receiving the heads of the pegs.

In assembly, the heads of the pegs sequentially penetrate the heat sink, the CPU package, and the engaging holes of the brackets. When the handle portion of the bracket is then moved in a direction, each neck slides along a slot and is retained in an end of the slot in a locking recess. Thereby, the pegs are attached in either of two sets of locking recesses at either of two different heights above the base and so can lock the heat sink to CPU packages of different thicknesses.

In an alternative embodiment, a locking device has a bracket with a plurality of cantilever parts extending in an arc around the base of the bracket. The slots defined in the cantilever parts correspondingly extend in an arc for receiving the necks of the pegs during a rotation of the bracket which securely locks the heat sink to the CPU package.

Other objects, advantages and novel features of the invention will become more apparent from the following detailed description of the present embodiment when taken in conjunction with the accompanying drawings.

DETAILED DESCRIPTION OF THE INVENTION

Figure 1:
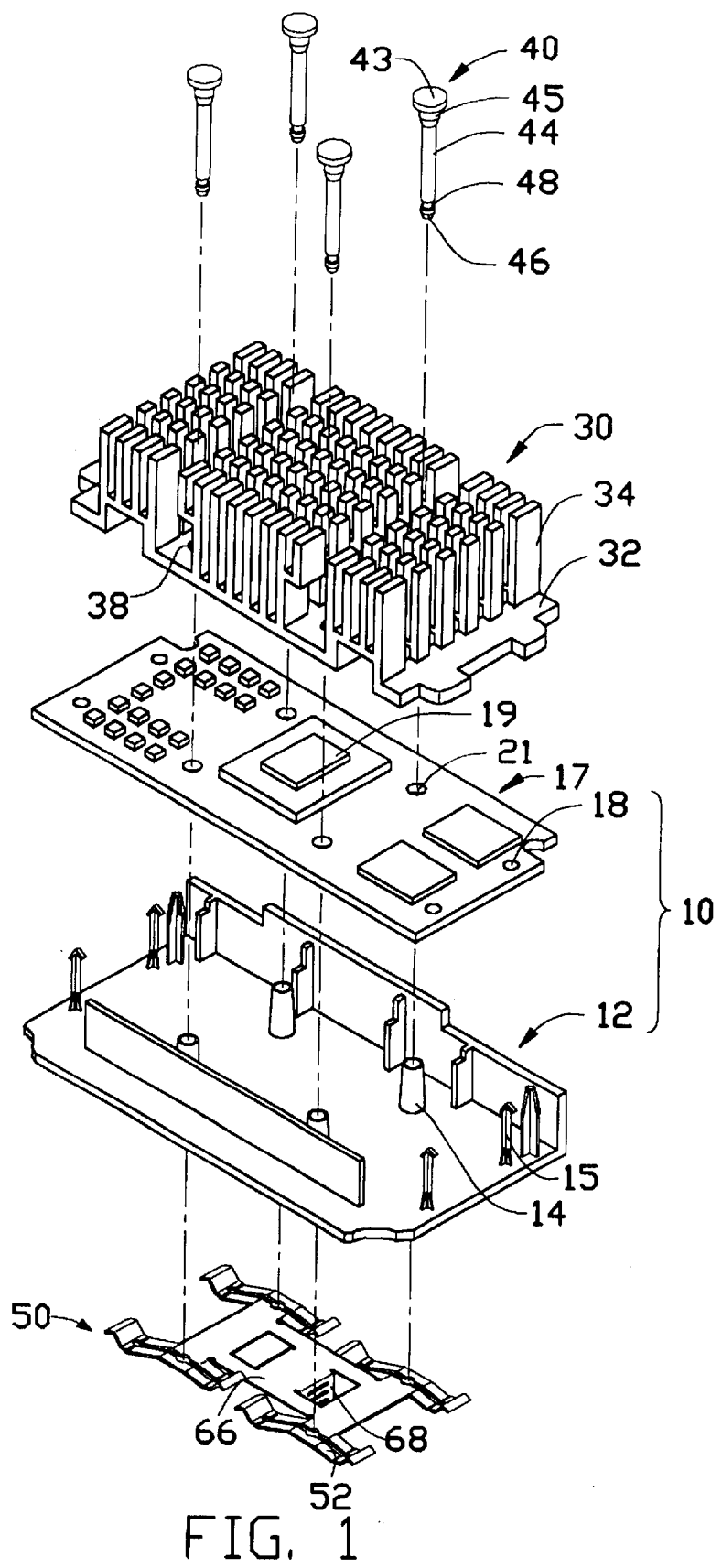
FIG. 1 is an exploded view of a CPU package, a heat sink and a locking device in accordance with a first embodiment of the present invention.

Referring to FIG. 1, a locking device in accordance with a first embodiment of the present invention comprises a plurality of pegs 40 engaging with a bracket 50 and extending through a CPU package 10 and a heat sink 30.

The CPU package 10 includes a printed circuit board 17 on which a CPU 19 is mounted and a shell 12 protecting the printed circuit board 17. The printed circuit board 17 defines four mounting holes 21 at corners of the CPU 19. The mounting holes 21 are respectively aligned with four sleeves 14 in the shell 12. A plurality of fluke holes 18 at opposite ends of the printed circuit board 17 is respectively aligned with a plurality of flukes 15 at opposite ends of the shell 12.

The heat sink 30 attached to the CPU package has a substrate 32 and a plurality of fins 34 upwardly depending from the substrate 32. A plurality of apertures 38 is defined in the substrate 32 aligned with the mounting holes 21 of the printed circuit board 17.

The pegs 40 each have a cap 43, a mating body 45 adjacent to the cap 43 for being received in the apertures 38 of the heat sink 30, a stanchion 44 extending from the mating body 45, a neck 48 projecting from the stanchion 44 and a head 46 protruding from the neck 48. Diameters of the necks 48 are smaller than those of either the stanchions 44 or the heads 46.

Figure 2:
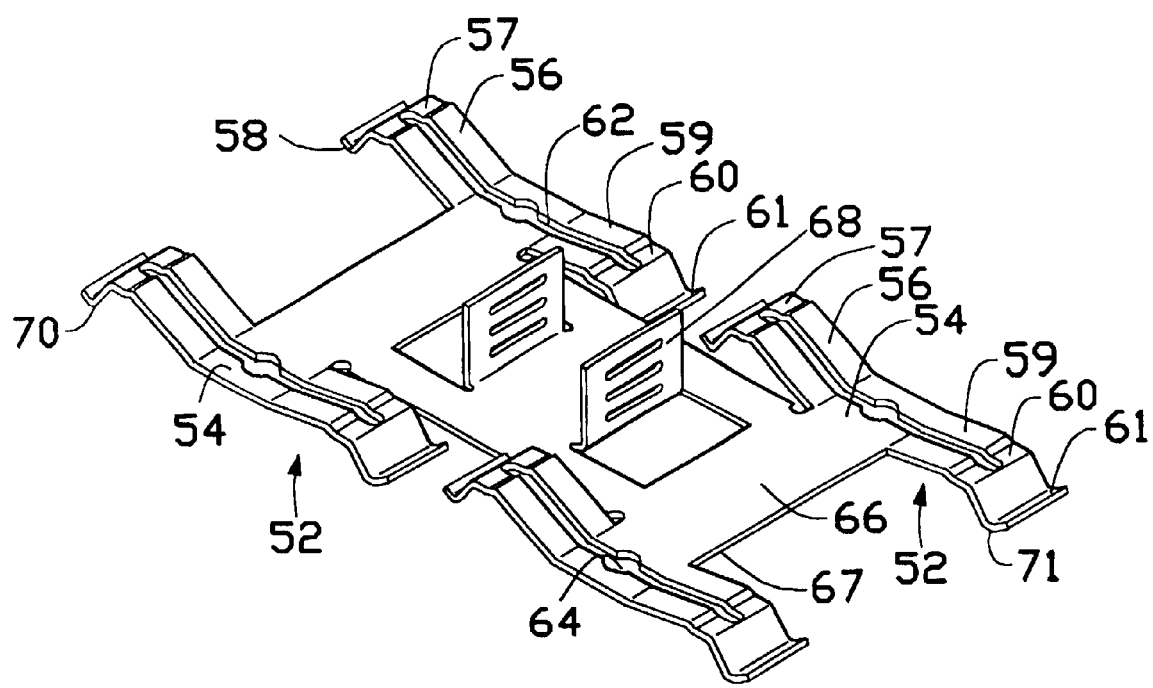
FIG. 2 is an enlarged perspective view of the other side of the bracket of FIG. 1.

The bracket 50, further referring to FIG. 2, includes a base 66 having four similar cantilever parts 52 longitudinally extending at corners thereof and a handle portion 68 downwardly depending therefrom. The cantilever parts 52 each have a flat body portion 54 outwardly extending from the base 66, a resilient first and second ramps 56, 59 extending from opposite ends of the body portion 54 and respectively attached to a first and second locking recesses 57, 60, which respectively join a first and second sustaining flanges 58, 61. The flat body portions 54 each define an engaging hole 64, which has a diameter greater than that of the heads 46, the engaging holes 64 being aligned with the sleeves 14, the mounting holes 21 and the apertures 38. The second ramp 59 depends at an angle less than that of the first ramp 56 and forms the second locking recess 60 at less height above the base 66 than the first locking recess 57. The first locking recess 57 extends approximately horizontally from the first ramp 56 and slightly protrudes toward the base 66 for securely retaining a neck of a peg therein. The arcuate first and second sustaining flanges 58 each have a first and second engaging surface 70, 71 at an underside thereof. The engaging surfaces 70, 71 are coplanar with a mating surface 67 of the base 66. The second locking recess 60 is essentially similar to the first locking recess 57 but extends from the second ramp 59. The second sustaining flange 61 is essentially similar to the first sustaining flange 58 but is at an opposite end of the cantilever part 52. The cantilever parts 52 each define a slot 62 extending from the first locking recess 57 to the second locking recess 60 and intersecting with the engaging hole 64 thereof. The width of the slots 62 is slightly larger than the diameter of the necks 48 of the pegs 40 for mating with the pegs 40 therein.

Figure 3:
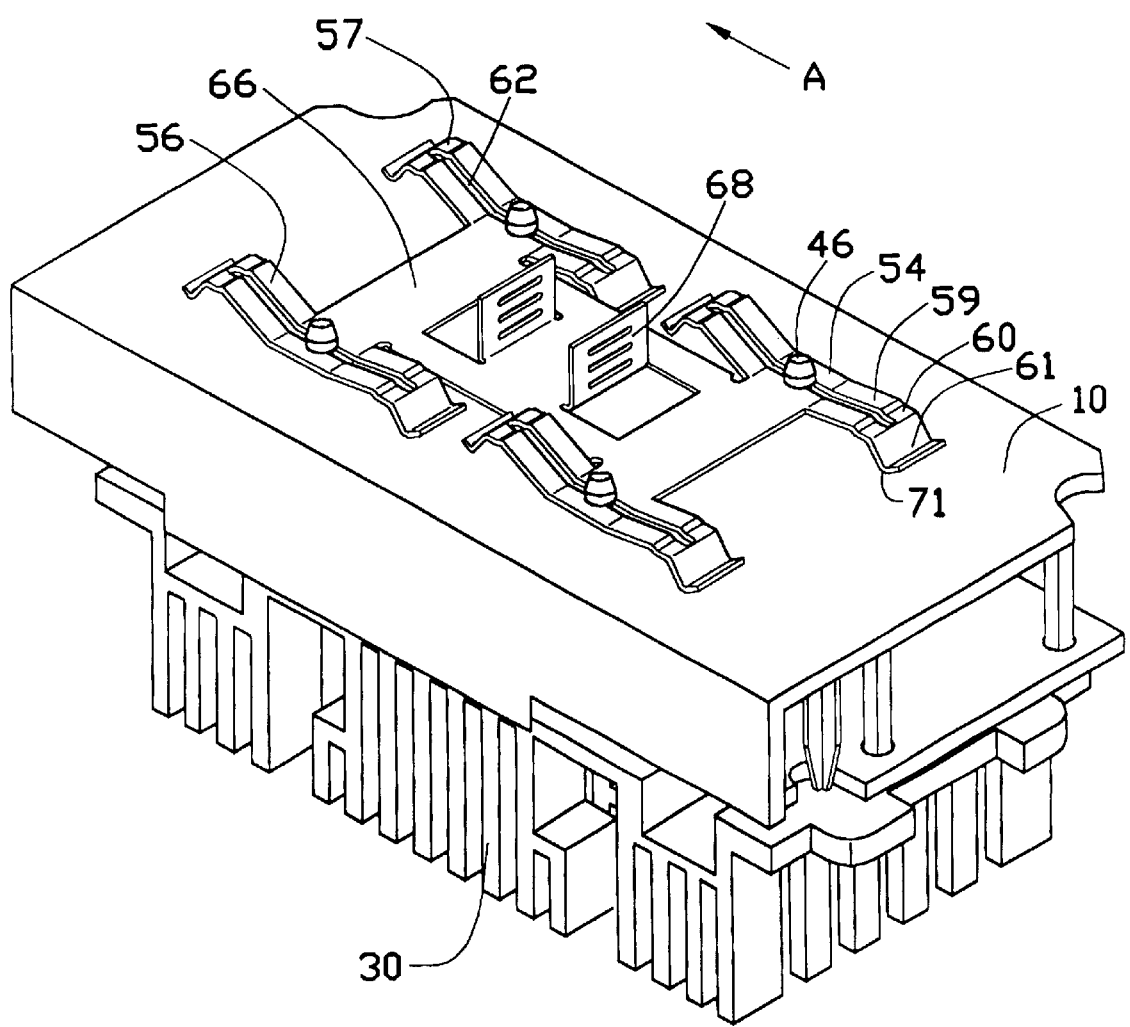
FIGS. 3 and 4 show sequential views of mounting the bracket of FIG. 2 to secure the CPU package and the heat sink.
Figure 4:
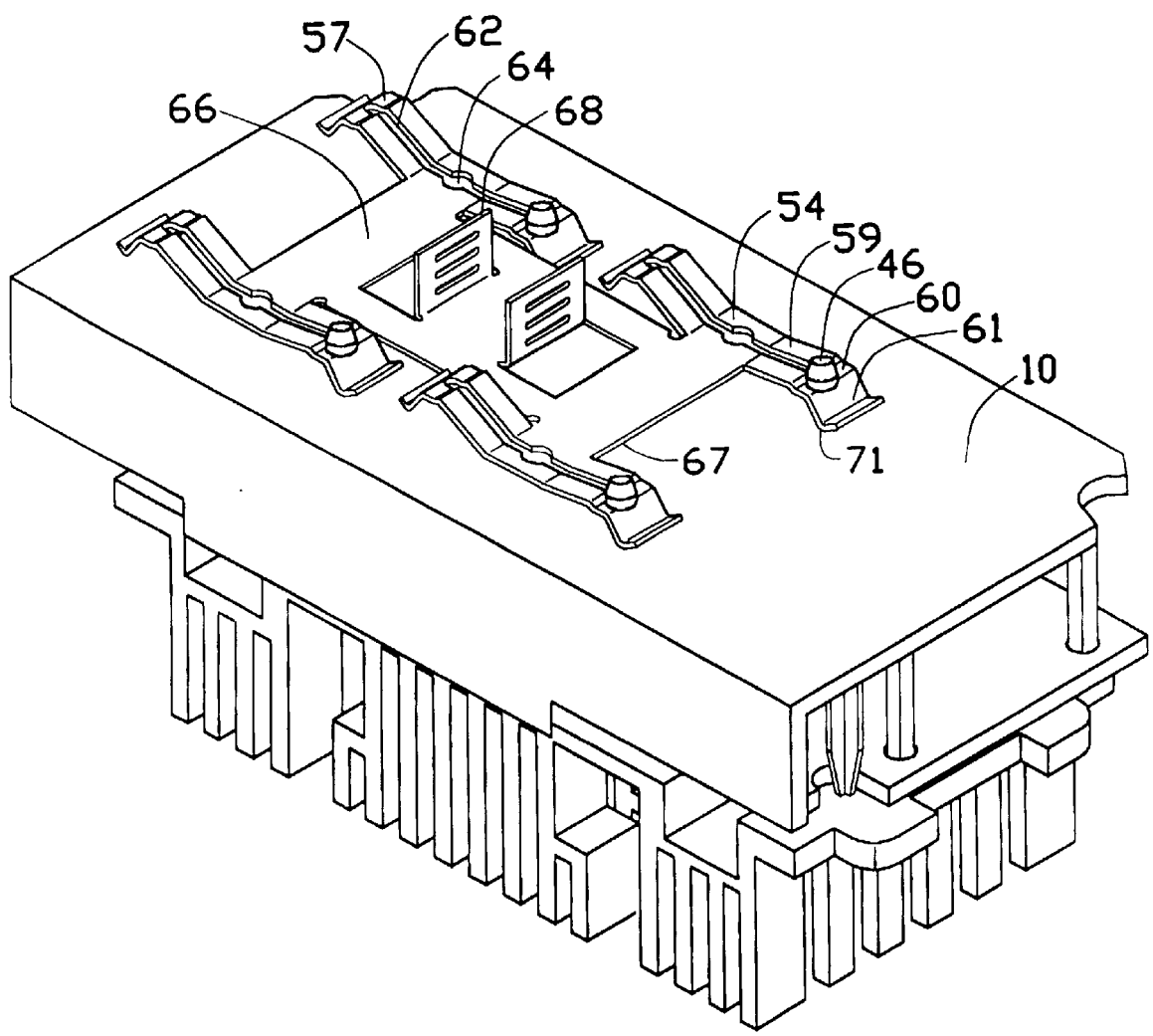

In assembly, referring to the FIGS. 3 and 4, the flukes 15 engage with the fluke holes 18 for locking the shell 12 to the printed circuit board 17. The pegs 40 sequentially penetrate corresponding apertures 38 in the heat sink 30, the mounting holes 21 in the printed circuit board 17, the sleeves 14 in the shell 12 and the engaging holes 64 in the bracket 50. The mating bodies 45 of the pegs 40 thereby engage with the apertures 38 in the heat sink 30 and the necks 46 of the pegs 40 are each received in a corresponding engaging hole 64 of the bracket 50. When the bracket 50 is then pushed with the handle portion 68 in a direction "A", the necks 48 of the pegs 40 subsequently slide along the slots 62 from the engaging holes 64 to the second ramps 59 and are secured in the ends of the slots 62 in the second locking recesses 60. The second engaging surface 71 of each cantilever part 52 is coplanar with the mating surface 67 of the base 66 and presses the bottom surface of the shell 12. Therefore, the shell 12, the printed circuit board 17 and the heat sink 30 are securely fastened together with the pegs 40 and the bracket 50. If the CPU package is thinner, the bracket 50 may be pushed in a direction opposite "A" so the necks 48 of the pegs 40 slide from the engaging holes 64 to the first ramps 56, and are secured in the ends of the slots 62 in the first locking recesses 57. Since the vertical distance from the base 66 to the first locking recess 57 is more than that from the base 66 to the second locking recess 60, the pegs 40 and the bracket 50 can accept a thinner CPU package.

Figure 5:
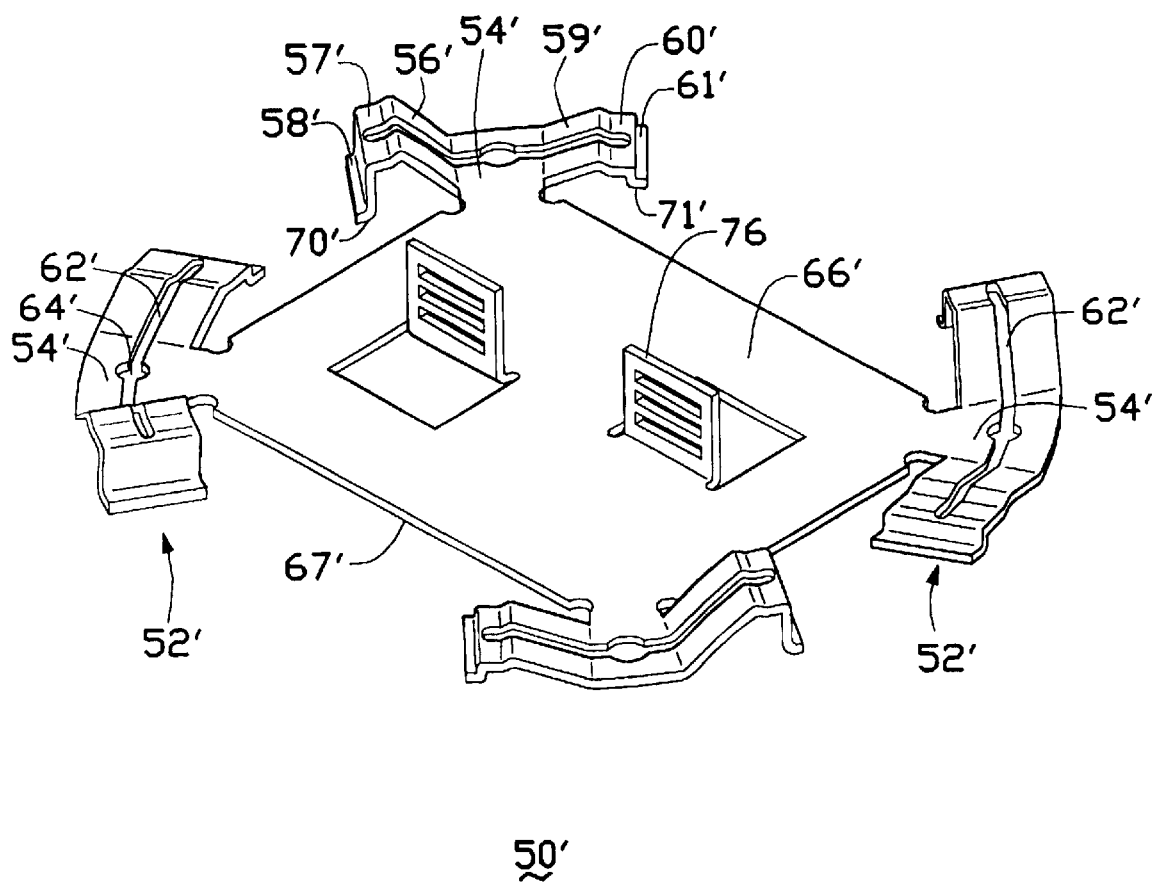
FIG. 5 is an enlarged perspective view of a bracket in accordance with an alternative embodiment of the present invention.

Referring to FIG. 5, an alternative embodiment provides a locking device with a bracket 50' and a plurality of pegs 40'. The bracket 50' possesses a base 66' and four cantilever parts 52' located at corners of the base 66'. The base 66' has a pair of torsion handle portions 76 downwardly depending therefrom. The cantilever parts 52' are essentially similar and extend along an arc relative to the center of the base 66'. The cantilever parts 52' each have a body portion 54' depending from a corner of the base 66', a resilient first ramp 56' depending from the body portion 54' at an upward angle, a first locking recess 57' substantially horizontally extending from the first ramp 56' and slightly protruding toward the base 66', and a first sustaining flange 58' depending from the first locking recess 57'. The cantilever parts 52' each also have a resilient second ramp 59' depending from an opposite side of the body portion 54' at an angle less than that of the first ramp 56', a second locking recess 60' extending from the second ramp 59' and slightly protruding toward the base 66', the second locking recess 60' having a lesser height above the base 66' than that of the first locking recess 57' thus being adapted to accommodate CPU packages varying in thickness. A second sustaining flange 61' extends from the second locking recess 60'. The first sustaining flange 58' and the second sustaining flange 61' respectively define first and second engaging surfaces 70', 71' being coplanar with a mating surface 67' of the base 66' for bearing on a bottom surface of the CPU package. The cantilever parts 52' each define a slot 62' arcuately extending from the first locking recess 57' to the second locking recess 60'. The body portions 54' each define an engaging hole 64' at the center of the slot 62'.

Figure 6:
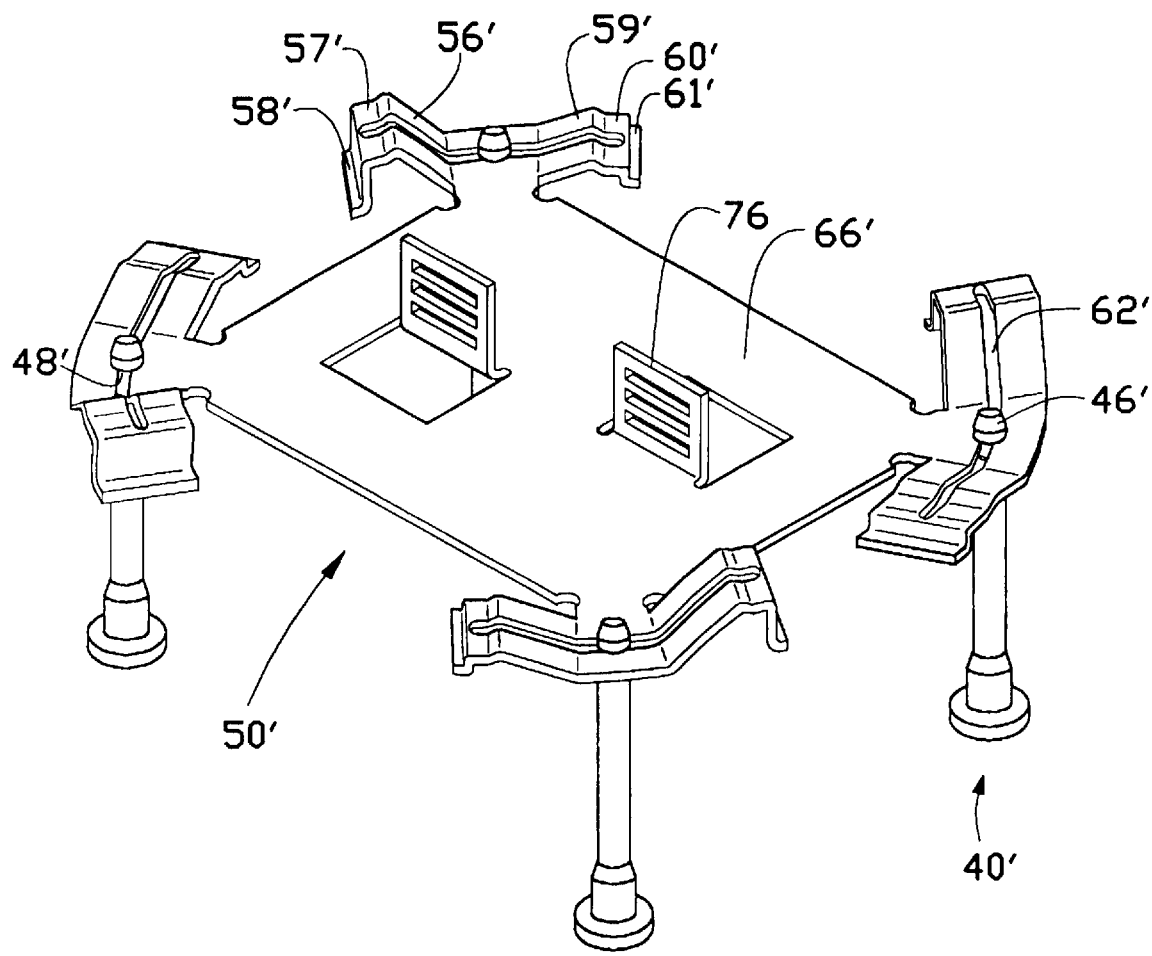
FIG. 6 is an enlarged perspective view of a bracket of FIG. 5 engaged with a plurality of pegs.
Figure 7:
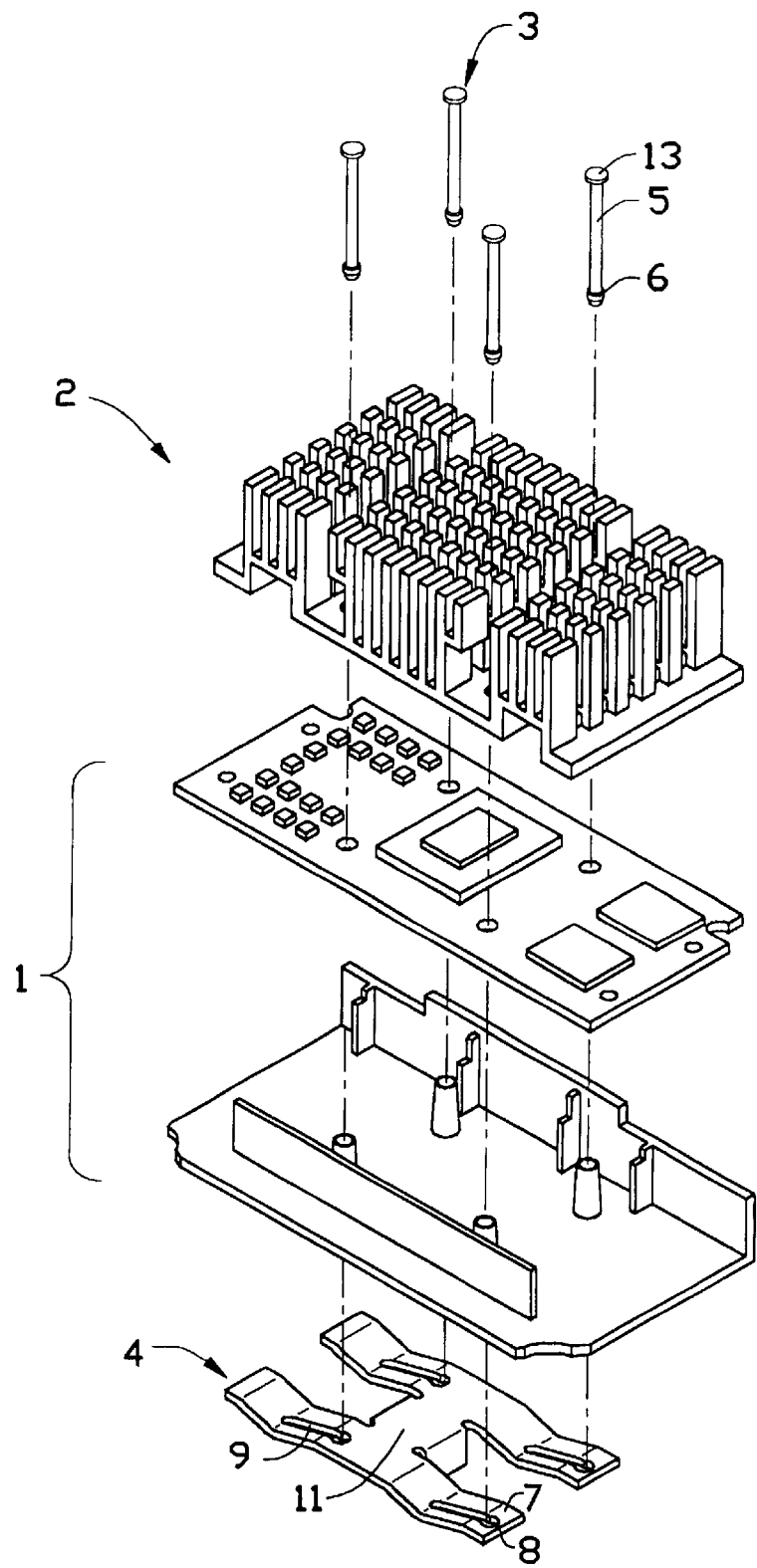
FIG. 7 is a perspective view of a CPU package, a heat sink and a prior art locking device.

Further referring to FIG. 6, the pegs 40' of the second embodiment are similar to those of the first embodiment, the pegs 40' each having a head 46' for penetrating an engaging hole 64' and a neck 48' for being received in the engaging hole 64'. In assembly, the heads 46' of the pegs 40' penetrate in sequence the heat sink (not shown), the CPU package (not show), and the engaging holes 64' of the bracket 50'. The necks 48' of the pegs 40' are received in the engaging holes 64' while the heads 46' of the pegs 40' protrude through the engaging holes 64'. The bracket 50' is then rotated using the torsion handle portions 76 in either a clockwise or a counterclockwise direction thereby securing the necks 48' in either the first locking recesses 57' or the second locking recesses 60'. The locking device, therefore, is suitable for two different thicknesses of CPU packages.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A locking device for locking a heat sink to electronic packages of a range of thicknesses, comprising:

a plurality of pegs each including a stanchion, a neck extending from an end of the stanchion and a head protruding from the neck; and a bracket having a base and a plurality of cantilever parts extending from the base, the cantilever parts each having a body portion continuing the base, a pair of inclined portions respectively depending from opposite ends of the body portion, a pair of locking recesses each continuing an associated inclined portion and spaced a different height from the base, a pair of sustaining flanges each continuing an associated locking recess for pressing against the package, a slot extending across the base, the pair of inclined portions and the pair of locking recesses, and an engaging hole defined through the slot for extension of the head of the peg and for a sliding movement of the bracket relative to the pegs to selectively engage the neck of the peg with a selected one of the associated pair of locking recesses.

2. The locking device as claimed in claim 1, wherein said neck of the peg has a diameter smaller than the head of the peg and than the slot of the bracket for sliding along the slot, and wherein said head has a diameter smaller than the engaging hole of the bracket and larger than the slot.

3. The locking device as claimed in claim 1, wherein said inclined portions depend from the body portions at different angles to form the locking recesses of different heights, and wherein said bracket is selectively movable in either direction to engage the peg in one of the locking recesses.

4. The locking device as claimed in claim 1, wherein said cantilever parts longitudinally extend in parallel to one another.

5. The locking device as claimed in claim 1, wherein said cantilever part has a handle portion consisted of two parallel plates.

6. The locking device as claimed in claim 1, wherein said cantilever parts angularly span about a center of the base.

7. The locking device as claimed in claim 6, wherein said slot is curved to permit a rotating movement of the bracket.

8. A locking device assembly comprising:

a heat sink defining a plurality of first holes;

a CPU package defining a plurality of second holes in alignment with the first holes;

at least one elongate peg including a stanchion extending through the heat sink and the CPU package, a cap, at one end thereof, abutting against the heat sink, and a head at the opposite other end; and a bracket including a base and at least two inclined resilient portions extending from the base, said two inclined resilient portions each forming a locking recess which is spaced a different height from the base, a slot extending along each said inclined resilient portion and interconnecting with the respective locking recess sustaining flange continuing each locking recess, the head of the peg lockingly engaging a selected one of said at least two locking recesses according to a combined thickness of the heat sink and the CPU package, thereby forcing the sustaining flange associated with the selected locking recess to press against the CPU package.

9. The assembly as claimed in claim 8, wherein the flanges of the two inclined resilient portions are spaced from the base with different distances when the head of the peg is not engaged with the bracket.

10. The assembly as claimed in claim 8, wherein the locking recesses are spaced from the base with different distances when the head of the peg is not engaged within either locking recess.

\* \* \* \* \*